US009818813B2

(12) United States Patent
Shen

(10) Patent No.: US 9,818,813 B2
(45) Date of Patent: Nov. 14, 2017

(54) METHOD FOR PRODUCING ARRAY SUBSTRATE AND ARRAY SUBSTRATE

(71) Applicants: BOE Technology Group Co., Ltd., Beijing (CN); Hefei BOE Optoelectronics Technology Co., Ltd., Anhui (CN)

(72) Inventor: Qiyu Shen, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

(*) Notice: Subject to any disclaimer, the term of this patent is extended or adjusted under 35 U.S.C. 154(b) by 0 days.

(21) Appl. No.: 15/122,213

(22) PCT Filed: Jul. 8, 2015

(86) PCT No.: PCT/CN2015/083543
§ 371 (c)(1),
(2) Date: Aug. 29, 2016

(87) PCT Pub. No.: WO2016/112663
PCT Pub. Date: Jul. 21, 2016

(65) Prior Publication Data
US 2016/0372531 A1    Dec. 22, 2016

(30) Foreign Application Priority Data
Jan. 13, 2015    (CN) .......................... 2015 1 0016188

(51) Int. Cl.
H01L 27/32    (2006.01)
H01L 21/77    (2017.01)
H01L 27/12    (2006.01)

(52) U.S. Cl.
CPC .......... *H01L 27/3258* (2013.01); *H01L 21/77* (2013.01); *H01L 27/3246* (2013.01);
(Continued)

(58) Field of Classification Search
None
See application file for complete search history.

(56) References Cited

U.S. PATENT DOCUMENTS 8,106,402 B2    1/2012    Yeo et al.
9,000,444 B2    4/2015    Lee et al.
(Continued)

FOREIGN PATENT DOCUMENTS

CN    101794049 A    8/2010
CN    102856506 A    1/2013
(Continued)

OTHER PUBLICATIONS

International Search Report and Written Opinion, including English translation of Box No. V, for International Application No. PCT/CN2015/083543, dated Sep. 30, 2015, 14 pages.
(Continued)

Primary Examiner — Asok K Sarkar
(74) Attorney, Agent, or Firm — Westman, Champlin & Koehler, P.A.

(57) ABSTRACT

Embodiments of the present application provide a method for producing an array substrate. The array substrate includes a planarization layer provided on a layer of thin film transistors and a first electrode provided on the planarization layer for a light emitting device. The method includes the steps of: forming a pixel definition layer for placing the first electrode, a via hole for the first electrode and a spacer on the planarization layer by a single patterning process with a single mask. The array substrate is produced by the method provided by the present embodiment, so that the number of (Continued)

the used patterning processes and the number of the used masks are reduced.

19 Claims, 6 Drawing Sheets

(52) U.S. Cl.
CPC ...... *H01L 27/3248* (2013.01); *H01L 27/1248* (2013.01); *H01L 27/1288* (2013.01); *H01L 2227/323* (2013.01)

(56) References Cited

U.S. PATENT DOCUMENTS

| | | | |
|---|---|---|---|
| 9,184,222 B2 | 11/2015 | Choi et al. | |
| 2014/0117371 A1 | 5/2014 | Ma | |
| 2014/0302670 A1* | 10/2014 | Kasahara | H01L 21/28008 438/652 |

FOREIGN PATENT DOCUMENTS

| | | |
|---|---|---|
| CN | 102881695 A | 1/2013 |
| CN | 103123910 A | 5/2013 |
| CN | 103151305 A | 6/2013 |
| CN | 104538357 A | 4/2015 |

OTHER PUBLICATIONS

Second Office Action for Chinese Patent Application No. 201510016188.3, dated Apr. 26, 2017, 7 pages.

* cited by examiner

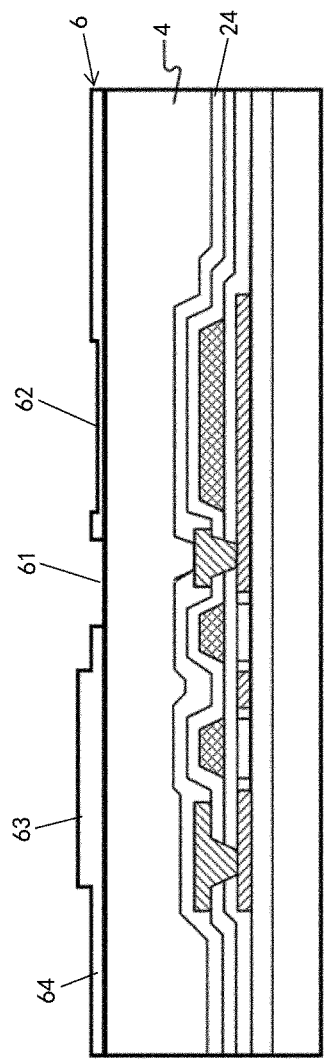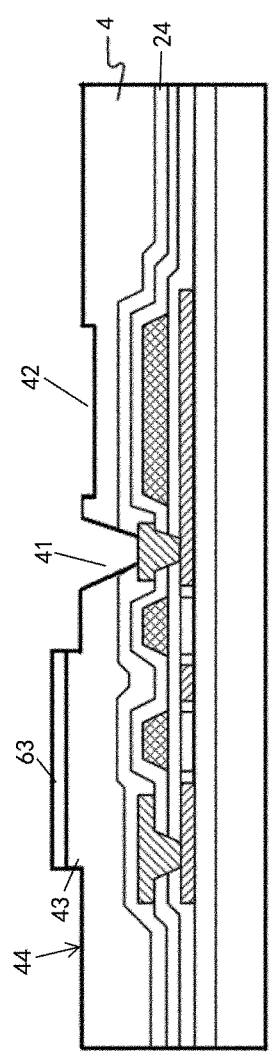
Fig. 3c
Fig. 3d

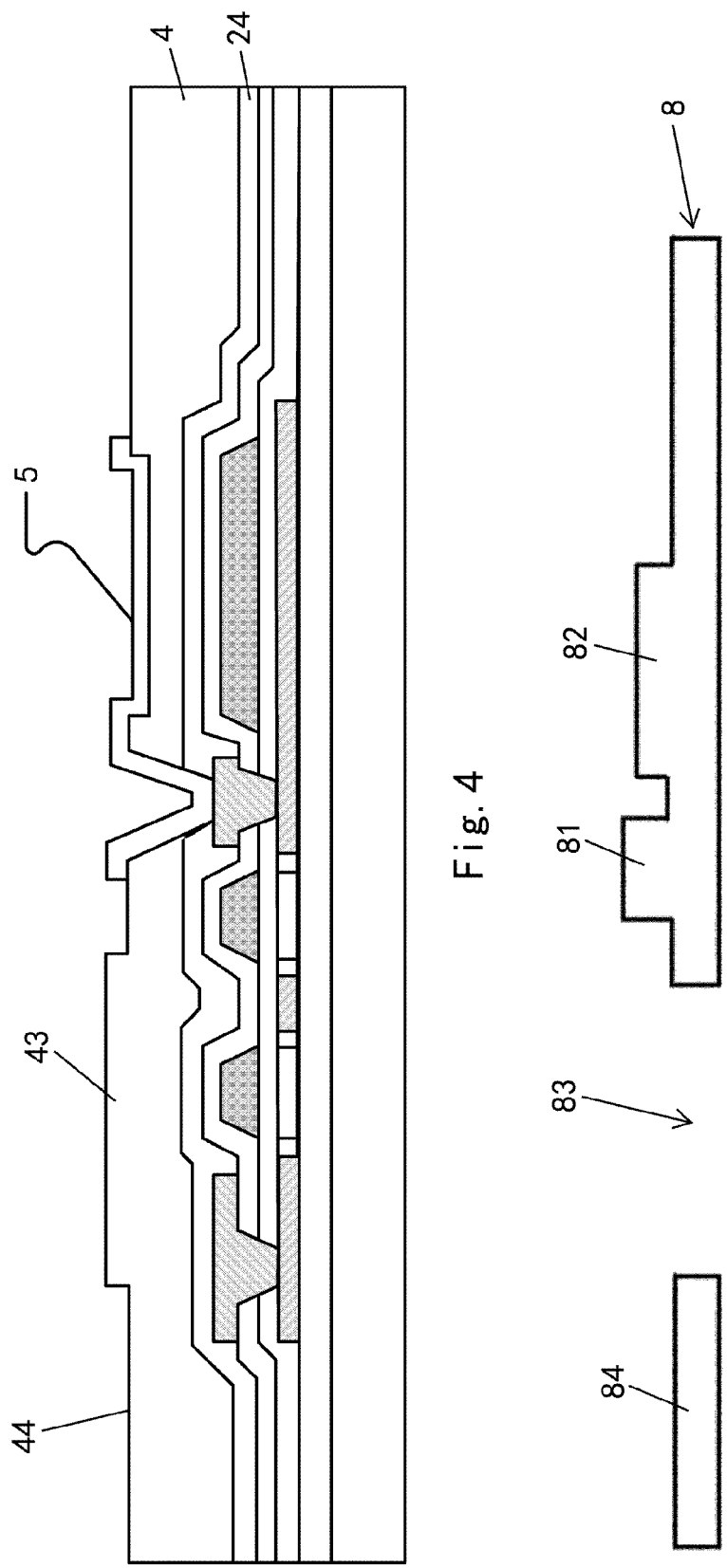

METHOD FOR PRODUCING ARRAY SUBSTRATE AND ARRAY SUBSTRATE

CROSS-REFERENCE TO RELATED APPLICATION

This application is a Section 371 National Stage Application of International Application No. PCT/CN2015/083543, file on 8 Jul. 2015, and entitled "Method for Producing Array Substrate and Array Substrate", and claims priority to Chinese Patent Application No. 201510016188.3 filed on Jan. 13, 2015, in the State Intellectual Property Office of China, the disclosures of which are incorporated herein by their reference.

BACKGROUND OF THE INVENTION

Field of the Invention

Embodiments of present disclosure relate to an array substrate for a display apparatus, and more particular to a method for producing an array substrate and the array substrate produced by this method.

Description of the Related Art

Currently, units of Organic Light Emitting Diodes (OLED) and Active Matrix Organic Light Emitting Diodes (AMOLED), being used as one kind of organic film electroluminescent devices, are not only widely applied in the display apparatus, but also are widely applied in the lighting field, due to the following advantages such as good vibration resistance, wide view angle, wide operation temperature, high contrast, and available flexible display or the like.

Generally, one pixel structure includes a pixel definition layer (PDL) for defining a pixel opening, and an OLED unit provided on the pixel opening. A luminous layer between a first electrode layer provided on a substrate and severing as a transparent anode layer and a second electrode layer severing as a metal cathode layer is made of organic semiconductor material, and it includes a hole injection layer, a hole transmission layer and an electron injection layer in sequence formed by vapor deposition. When the OLED unit can obtain a suitable electrical power supply, holes will be injected through the first electrode layer and electrons will be injected through the second electrode layer respectively, and then the holes and the electrons will be conducted to the luminous layer and thus radiation recombination will be generated at the luminous layer. The electrons at an outer layer of the luminous layer absorb carriers and are recombined with the carriers. After their energy are released, the electrons will be in an excitation state. Therefore, luminescence is achieved and the light is emitted out from the pixel opening.

SUMMARY

An embodiment of the present application provides a method for producing an array substrate and the array substrate produced by such method, so that the number of the used patterning processes and the number of the used masks are reduced.

An embodiment according to one aspect of the present application provides a method for producing an array substrate, wherein the array substrate comprises a planarization layer provided on a layer for thin film transistors and a first electrode provided on the planarization layer for a light emitting device, the method comprising the steps of:

forming a pixel definition layer for placing the first electrode, a via hole for the first electrode and a spacer on the planarization layer by a single patterning process with a single mask.

In the method for producing the array substrate according to an embodiment of the present application, the single patterning process comprises the steps of:

coating photo resist onto the planarization layer;

exposing the photo resist to light with the mask and developing it;

removing parts of the planarization layer having different thicknesses at different positions of the planarization layer by an etching process, so as to form the via hole, the spacer and the pixel definition layer on the planarization layer; and peeling off non-removed photo resist.

In the method for producing the array substrate according to an embodiment of the present application, in the step of exposing the photo resist to light with the mask and developing it, exposure light beam having different intensities passes through the mask, so that a photo resist fully reserved part, a first photo resist partially reserved part and a photo resist fully removed part are formed after carrying out the exposing and developing processes, wherein the photo resist fully reserved part corresponds to the spacer, the photo resist fully removed part corresponds to the via hole, the first photo resist partially reserved part corresponds to the pixel definition layer.

In the method for producing the array substrate according to an embodiment of the present application, the photo resist is positive, and the mask comprises a first region, a second region and a third region corresponding to the via hole, the pixel definition layer and the spacer respectively, wherein the exposure light beam has a transmittivity at the first region larger than that at the second region, and the transmittivity of the exposure light beam at the second region is larger than that of the exposure light beam at the third region.

In the method for producing the array substrate according to an embodiment of the present application, the transmittivity of the exposure light beam at the first region is 100%, the transmittivity of the exposure light beam at the second region is 65%-75%, and the transmittivity of the exposure light beam at the third region is 0.

In the method for producing the array substrate according to an embodiment of the present application, the first region is a through hole extending through a thickness of the mask, and a thickness of the second region is less than that of the third region.

In the method for producing the array substrate according to an embodiment of the present application, the mask further comprises a fourth region corresponding to a surface of the planarization layer, and the transmittivity of the exposure light beam at the fourth region is larger than that of the exposure light beam at the third region and less than that of the exposure light beam at the second region.

In the method for producing the array substrate according to an embodiment of the present application, the exposure light beam has a transmittivity of 25-35% at the fourth region.

In the method for producing the array substrate according to an embodiment of the present application, the first electrode electrically connected to a drain electrode of the thin film transistor in the layer for thin film transistors is formed at the via hole and the pixel definition layer by a PVD process, wherein a region where the pixel definition layer is located is formed as a recess with respect to the surface of the planarization layer.

In the method for producing the array substrate according to an embodiment of the present application, the photo resist is negative, and the mask comprises a fifth region, a sixth region and a seventh region corresponding to the via hole, the pixel definition layer and the spacer respectively, wherein the exposure light beam has a transmittivity at the fifth region less than that at the sixth region, and the transmittivity of the exposure light beam at the sixth region is less than that of the exposure light beam at the seventh region.

In the method for producing the array substrate according to an embodiment of the present application, the transmittivity of the exposure light beam at the fifth region is 0, the transmittivity of the exposure light beam at the sixth region is 25%-35%, and the transmittivity of the exposure light beam at the seventh region is 100%.

In the method for producing the array substrate according to an embodiment of the present application, a thickness of the fifth region is larger than that of the sixth region, and the seventh region is a through hole extending through a thickness of the mask.

In the method for producing the array substrate according to an embodiment of the present application, the mask further comprises an eighth region corresponding to a surface of the planarization layer, and the transmittivity of the exposure light beam at the eighth region is less than that of the exposure light beam at the seventh region and larger than that of the exposure light beam at the sixth region.

In the method for producing the array substrate according to an embodiment of the present application, the exposure light beam has a transmittivity of 65-75% at the eighth region.

An embodiment according to another aspect of the present application provides an array substrate, produced by the method according to any of the above embodiments.

BRIEF DESCRIPTION OF THE DRAWINGS

In order to enable the objectives, technical solutions and advantages of the present application to become clear, the present application will be further set forth below with reference to the accompanied drawings and in conjunction with the specific examples.

FIGS. 3a-3e show in partial cross-sectional views an operation process for forming a via hole, a pixel definition layer and a spacer by a patterning process in accordance with the method of the first illustrative embodiment of the present application, on the basis of FIG. 2;

FIG. 4 is a partial cross-sectional view of a first electrode layer formed on the basis of FIG. 3e;

FIG. 5 is a partial cross-sectional view of a mask used in a process for producing the array substrate in accordance with a method of a second illustrative embodiment of the present application, in order to form a via hole, a pixel definition layer and a spacer by a patterning process.

DETAINED DESCRIPTION OF PREFERRED EMBODIMENTS OF THE INVENTION

Technical solutions of the present application will be further explained by examples and in combination with the accompanied drawings. In the specification, the same or similar reference numbers indicate the same or similar components. The following description about the embodiments of the present application with reference to the accompanied drawings is intended to interpret the general inventive concept of the present application, rather than a limitation to the present application.

According to the general inventive concept of the present application, it provides a method for producing an array substrate. The array substrate includes a planarization layer provided on a layer of thin film transistors and a first electrode on the planarization layer for a light emitting device. The method includes the following steps: forming onto the planarization layer, a pixel definition layer for placing the first electrode, a via hole for the first electrode and a spacer located on the pixel definition layer by a single patterning process with a single mask. The pixel definition layer, the via hole and the spacer are formed on the planarization layer by the single patterning process with the single mask, so that the number of the used patterning processes is reduced, and the number of the used masks is decreased, thereby simplifying a manufacturing process of the array substrate and reducing the manufacturing cost.

Within the following detailed description, for convenience of the interpretation, numerous specific details are set forth to provide a full understanding to the embodiments disclosed herein. However, it is obvious that one or more embodiments can be implemented without these specific details. In other instances, known structures and devices are shown graphically for simplifying the drawings.

Figure 1:
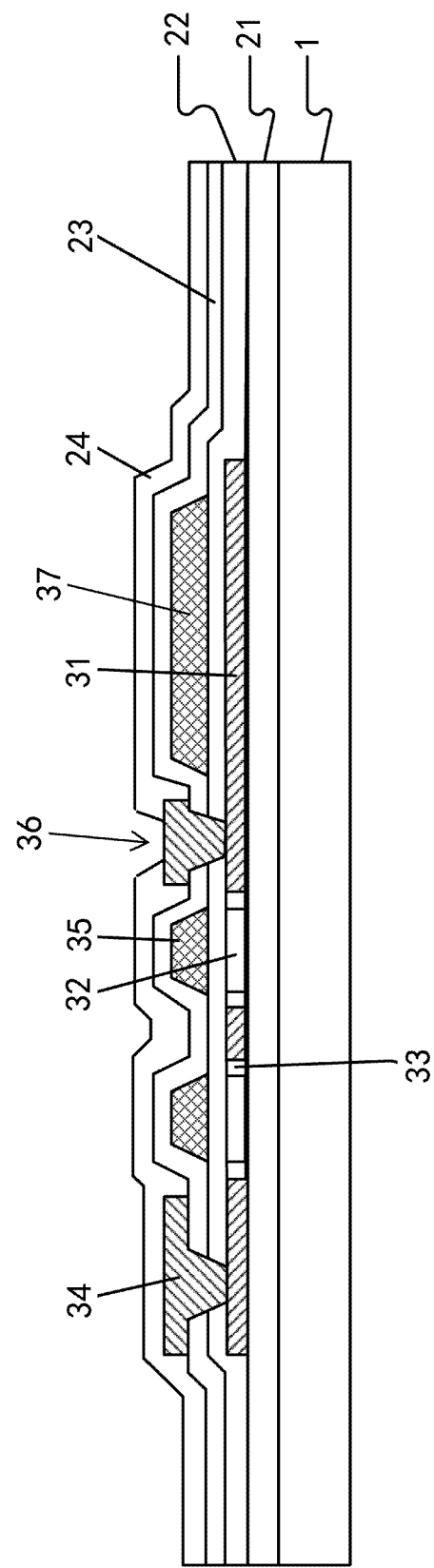
FIG. 1 is a partial cross-sectional view of a thin film transistor formed during a process for producing an array substrate in accordance with a method of a first illustrative embodiment of the present application.
Figure 2:
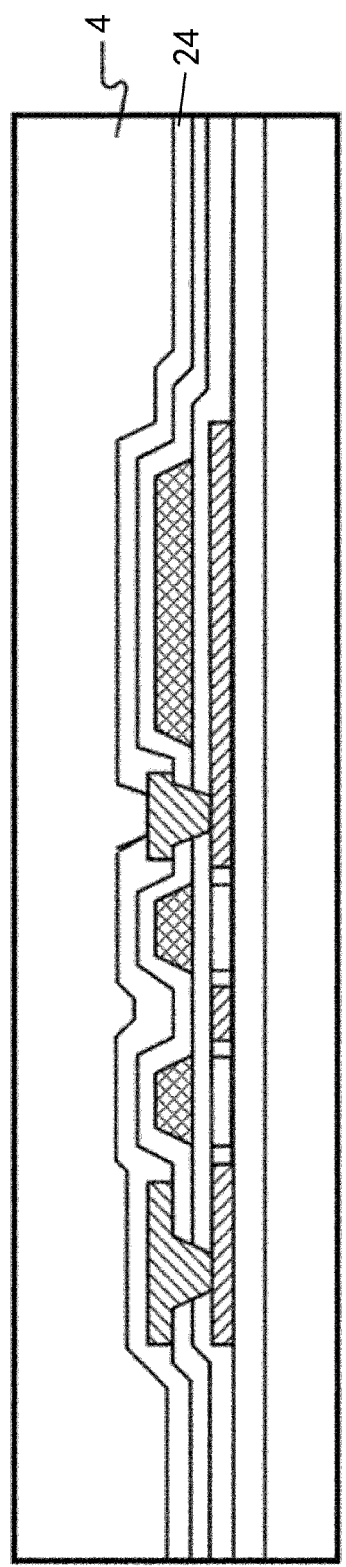
FIG. 2 is a partial cross-sectional view of a planarization layer formed on the basis of FIG. 1.

FIG. 2 is a partial cross-sectional view of a planarization layer formed on the basis of FIG. 1; and FIGS. 3a-3e are partial cross-sectional views for showing an operation process in which the via hole, the pixel definition layer and the spacer are formed by the patterning process in accordance with a method of a first illustrative embodiment of the present application, on the basis of FIG. 2. With reference to FIGS. 2 and 3a-3e, an embodiment of the present application provides a method for producing an array substrate, which includes a planarization layer 4 provided on the layer of thin film transistors and made from a photosensitive organic resin material, and a first electrode 5 provided on the planarization layer 4 for a light emitting device. The method includes the following steps: forming a pixel definition layer 42 for placing the first electrode, a via hole 41 for the first electrode and a spacer 43 on the planarization layer 4 by a single patterning process with a single mask 7. The pixel definition layer 42, the via hole 41 and the spacer 43 are formed by the single patterning process with a single half tone or gray tone mask 7, so that the number of the used patterning processes is reduced and the number of the used masks is decreased, thereby simplifying the manufacturing process of the array substrate and reducing the manufacturing cost.

FIG. 1 is a partial cross-sectional view of a thin film transistor formed during the process for producing the array substrate in accordance with the method of the first illustrative embodiment of the present application. With reference to FIG. 1, an array substrate according to one illustrative embodiment of the present application includes: a substrate 1 made from for example glass or transparent resin material, a buffer layer 21 formed on the substrate 1, a polycrystalline silicon (P-Si) film formed on the buffer layer 21, as well as a plurality of thin film transistors, a gate insulation layer 22, an intermediate medium layer 23 and a passivation layer 24 formed on the P-Si film.

Next, with reference to FIG. 1, a process for forming the thin film transistor within a procedure for manufacturing the array substrate in accordance with one illustrative embodiment of the present application will be described.

Firstly, the buffer layer 21 is formed on the substrate 1 by depositing films of $SiN_x$ and $SiO_2$ in sequence by a plasma chemical vapor deposition method. An amorphous silicon (a-Si) film is deposited on the buffer layer 21, and becomes the Poly-Si film by transforming a-Si into Poly-Si via an Excimer Laser Anneal, to form a Poly-Si film. After that, a plurality of Poly-Si islands to be desired are formed by a lithographic process and a dry etching process thereof, and one of the Poly-Si islands can be used as one capacitance electrode 31 of a storage capacitor electrically connected to a drain electrode of the thin film transistor. Then, a doping process of N type channel is carried out, for example, B+ doping, so as to compensate for a threshold voltage Vth and to achieve the desired N type channel. Further, n+ doping process is carried out so that a doping region 32 of Poly-Si channels corresponding to source and drain electrodes of the thin film transistor is formed as an active layer region. For example, the doping material is PHx+. And then, a gate insulation layer 22 is formed on the buffer layer 21.

Subsequently, a process for forming a gate layer is performed. Specifically, a gate electrode 35 to be desired and another capacitance electrode 37 of the storage capacitor are formed by a thin film deposition process, a lithographic process and an etching process. A lightly doped drain (LDD, a thin layer resistance transition zone) is further formed by a doping process for the LDD, so as to reduce a leakage current of a low temperature poly-silicon thin film transistor. After that, a p+ doping process is performed so as to form a P type channel, in which the doping material is B+.

Thereafter, a process for forming the via hole is carried out. Specifically, after finishing the p+ doping process, the $SiN_x$ and $SiO_2$ materials are deposited in sequence, and an activation (hydrogenation) process is performed so as to form an intermediate medium layer 23. Then, a first bridging via hole is formed within the intermediate medium layer 23 and the gate insulation layer 22 by a lithographic process and an etching process.

And then, a wire bonding process is performed. Specifically, Ti—Al—Ti metal material is deposited through the first bridging via hole by a PVD method, and a wiring layer 34 electrically connected to the source electrode of the thin film transistor is made by a lithographic process and an etching process.

Next, a process for forming a passivation layer 24 is carried out. Specifically, the passivation layer 24 is formed by depositing SiNx film material by a CVD method; and a second bridging via hole 36 for extending to the drain electrode of the thin film transistor is formed within the passivation layer 24 by a lithographic process and an etching process.

Continually, as shown in FIG. 2, a planarization layer 4 is formed on the passivation layer 24 on the basis of FIG. 1. In one illustrative example, the planarization layer 4 is made from a photosensitive organic resin material, but the present application is not limited to this. In one alternative example, the planarization layer 4 can be formed by depositing SiNx and/or $SiO_2$ film(s) via a PVD method.

Figure 3A:
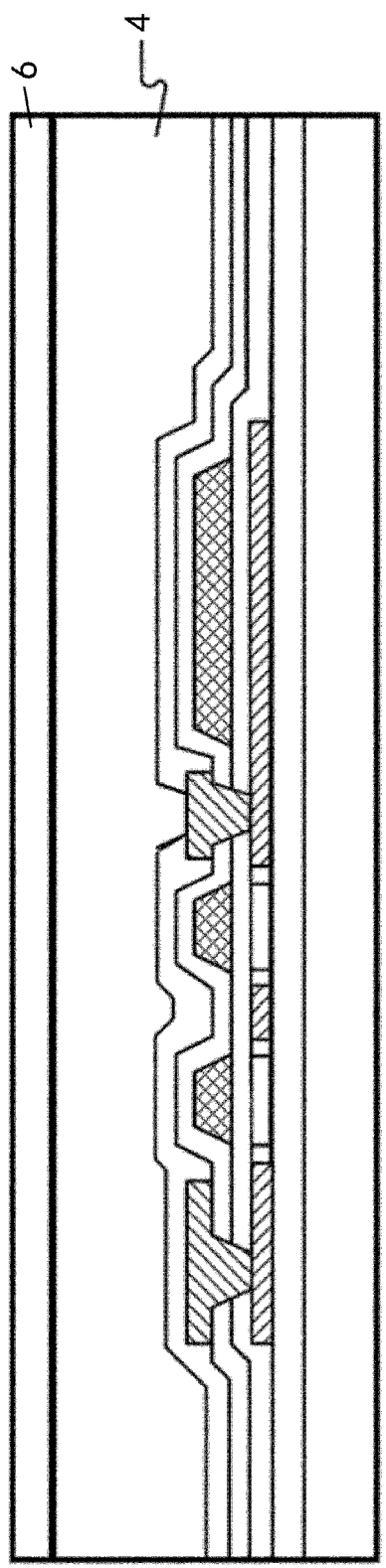
Figure 3B:
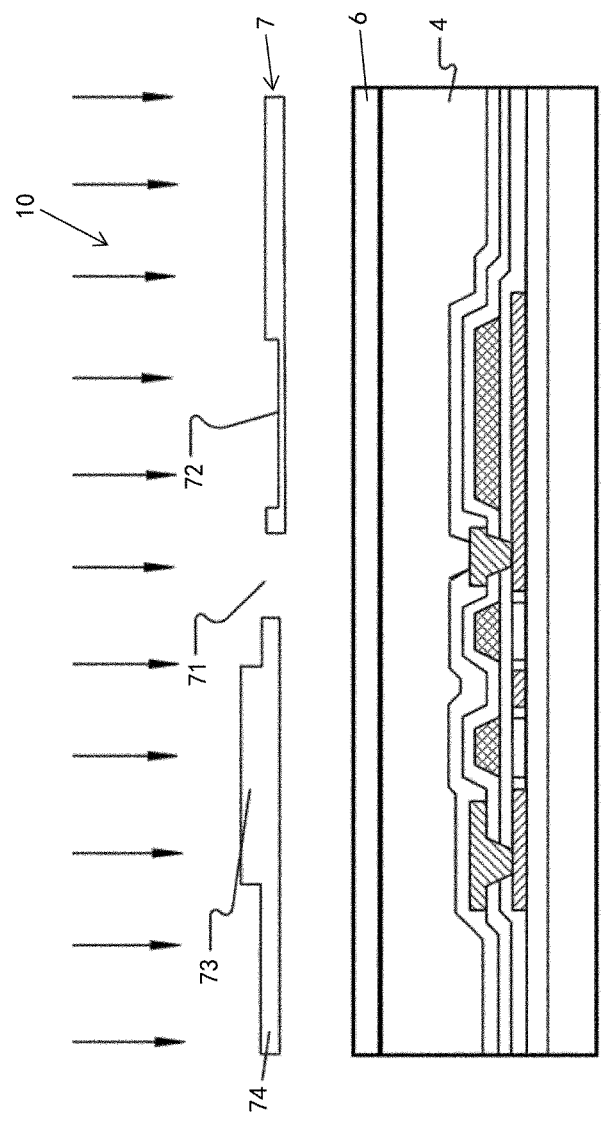
Figure 3E:
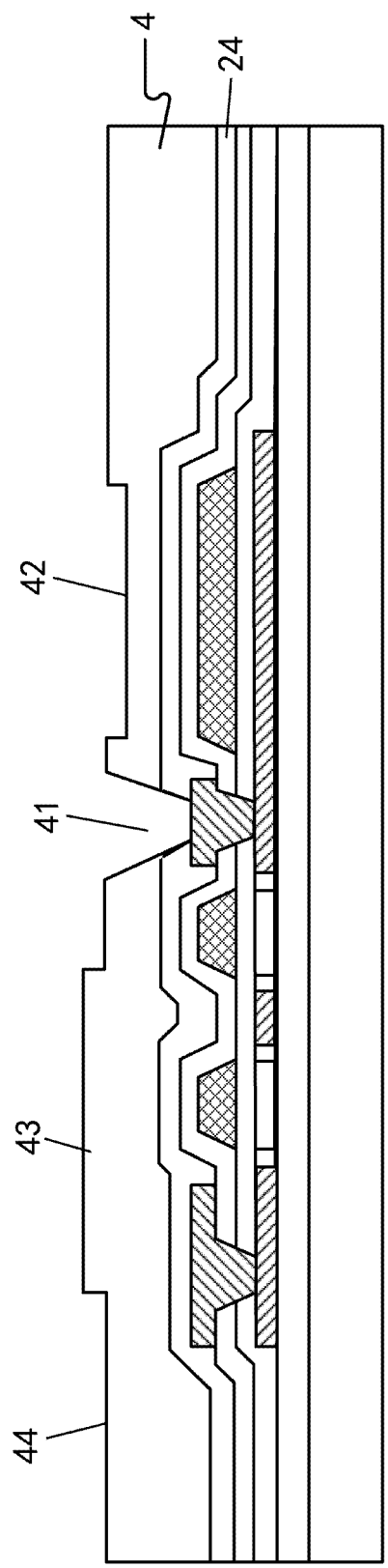

In one example of the present application, the single patterning process includes the following steps: coating photo resist 6 onto the planarization layer 4, as shown in FIG. 3a; exposing the photo resist 6 to light and developing it with a mask 7, as shown in FIGS. 3b and 3c; removing parts of the planarization layer having different thicknesses at different positions of the planarization layer by means of an etching process, as shown in FIG. 3d, so as to form the via hole 41, the spacer 43 and the pixel definition layer 42 on the planarization layer; and peeling off non-removed photo resist, as shown in FIG. 3e. In this way, the pixel definition layer 42, the via hole 41 and the spacer 43 are formed by the single patterning process with the single mask 7, thereby reducing the number of the used patterning processes and the number of the used masks 7.

In one illustrative embodiment, the array substrate can be an OLED (Organic Light Emitting Diode) unit based array substrate or an AMOLED (Active Matrix Organic Light Emitting Diode) unit based array substrate. For example, the OLED unit includes a first electrode layer 5 provided on the pixel definition layer 42 and used as a transparent anode layer, a second electrode (not shown) used as a metal cathode layer, and a luminous layer (not shown) between them.

In one embodiment, as shown in FIG. 3c, as for the step of exposing and developing the photo resist 6 with the mask 7, the exposure light beam 10 having different intensities passes through the mask 7, so that a photo resist fully reserved part 63, a first photo resist partially reserved part 62 and a photo resist fully removed part 61 are formed after carrying out the exposing and developing processes. The photo resist fully reserved part 63 corresponds to the spacer 43, the photo resist fully removed part 61 corresponds to the via hole 41, the first photo resist partially reserved part 62 corresponds to the pixel definition layer 42. In this way, the exposure light beam passing through the mask 7 is controlled to have different intensities, so that the different parts of the photo resist 6 will generate different changes in terms of performance, so as to facilitate the subsequent developing operation. And, after carrying out the developing process, the photo resist 6 will have different thicknesses.

It should be understood for those skilled in the art that the term "first photo resist partially reserved part" mentioned herein does not mean that after the exposing and developing processes to be carried out, the thickness of the reserved photo resist is half of an initial thickness of the photo resist, but means that a ratio of the thickness of the reserved photo resist to an initial thickness of the photo resist is for example about 40%, 50%, 60%, 70%, 75% or the like.

In one embodiment, the photo resist 6 is positive, and the mask 7 includes a first region 71, a second region 72 and a third region 73 corresponding to the via hole 41, the pixel definition layer 42 and the spacer 43 respectively. A transmittivity of the exposure light beam 10 at the first region 71 is larger than that of the exposure light beam 10 at the second region 72, and the transmittivity of the exposure light beam 10 at the second region 72 in turn is larger than that of the exposure light beam 10 at the third region 73. For example, the transmittivity of the exposure light beam at the first region is about 100%, the transmittivity of the exposure light beam at the second region is about 65-75%, preferably 70%; and the transmittivity of the exposure light beam at the third region is near zero. In one example, the UV light is used as the exposure light beam 10. It should be understood that the different regions have different transmittivities for the exposure light beam 10, so that the exposure light beam passing through the mask 7 has different intensities, thereby different degrees of the exposure are carried out onto the photo resist.

In one embodiment, as shown in FIG. 3b, the first region 71 of the mask is a through hole extending through the thickness of the mask, and the second region 72 has a thickness smaller than that of the third region 73. In this way, the mask is set to have different thicknesses, so that after passing through the mask 7, the exposure light beam has different intensities. Further, the mask 7 further includes a fourth region 74 corresponding to a surface 44 of the planarization layer 4. The exposure light beam 10 has a transmittivity at the fourth region 74 larger than that at the third region 73 but less than that at the second region 72. For example, the transmittivity of the exposure light beam 10 at the fourth region 74 is about 25%-35%, preferably 30%. In this way, after the patterning process, the thickness of all parts of the planarization layer will change, and the remaining areas of the planarization layer 4 except the areas in which the via hole 41, the pixel definition layer 42 and the spacer 43 are located will become more flat.

In one embodiment, on the basis of FIG. 3e, a first electrode 5 connected to the drain electrode of the thin film transistor in the layer of thin film transistors is formed within the via hole 41 and on the pixel definition layer 42. The area where the pixel definition layer 42 is located is formed as a recess with respect to the surface 44 of the planarization layer. Specifically, an indium tin oxide (ITO) material is deposited by a PVD process through the via hole; and the first electrode layer 5 passing through the via hole 42 and the second bridging via hole is formed on the pixel definition layer 42 by the patterning process. The first electrode layer 5 can be used as the anode of the light emitting unit. In one embodiment, the first electrode layer 5 can be made from the material such as three layers of ITO-Ag-ITO, Ag, or Al, so that the first electrode layer can have good reflection and conduction properties.

It should be understood that the second bridging via hole 36 may be formed upon carrying out the patterning process to the planarization layer, rather than upon forming the passivation layer 24. That is, when the patterning process to the planarization layer is carried out, the via hole 41 extending through the planarization layer 4 and the second bridging via hole 36 extending through the passivation layer 24 may be formed at the same time, thereby simplifying the manufacturing process thereof.

FIG. 5 is a partial cross-sectional view of a mask used in a process for producing the array substrate in accordance with a method of a second illustrative embodiment of the present application, in order to form a via hole, a pixel definition layer and a spacer by a patterning process. With reference to FIG. 5, in the method of the second illustrative embodiment, the photo resist is negative, and the single half tone or gray tone mask 8 used to carry out the patterning process includes a fifth region 81, a sixth region 82 and a seventh region 83 corresponding to the via hole 41, the pixel definition layer 42 and the spacer 43 respectively. The transmittivity of the exposure light beam at the fifth region 81 is less than that of the exposure light beam at the sixth region 82, whereas the transmittivity of the exposure light beam at the sixth region 82 in turn is less than that of the exposure light beam at the seventh region 83. For example, the transmittivity of the exposure light beam at the fifth region 81 is approximately zero, the transmittivity of the exposure light beam at the sixth region 82 is about 25-35%, preferably 30%; and the transmittivity of the exposure light beam at the seventh region 83 is about 100%.

In one embodiment, the thickness of the fifth region 81 is larger than that of the sixth region 82, and the seventh region 83 is a through hole extending through the thickness of the mask. The mask 8 further includes an eighth region 84 corresponding to the surface 44 of the planarization layer. The exposure light beam has a transmittivity at the eighth region 84 less than that at the seventh region 83 but larger than that at the sixth region 82. For example, the transmittivity of the exposure light beam at the eighth region 84 is about 65%-75%, preferably 70%.

As described above, the photo resist of the present embodiment includes positive photo resist material or negative photo resist material. The positive photo resist material is meant to be a substance which is not soluable in a development liquid before exposure, but after the exposure is soluble into the development liquid. The negative photo resist material is meant to be a substance which is soluable in a development liquid before exposure, but after the exposure is not soluble into the development liquid. It should be understood that the process in which the negative photo resist is used for carrying out the patterning process, is similar to the process in which the positive photo resist is used for carrying out the patterning process, and the resulting technical effects of them are also similar to each other. Therefore, it is not repeatedly discussed again.

In accordance with a further embodiment of the present application, it provides an array substrate produced by the method in any of the above embodiments. Such array substrate can be applied to a display apparatus. The display apparatus can be any product or component having the display function, such as a mobile phone, a panel computer, a TV, a display screen, a note computer, a digital photo frame, a navigator, an electronic paper or the like.

With the method for producing the array substrate provided by the embodiments of the present application and the array substrate produced by these methods, the pixel definition layer, the via hole and the spacer are formed on the planarization layer by the single patterning process with the single mask, thereby reducing the number of the used patterning processes and the number of the used masks. In this way, the manufacturing process of the array substrate is simplified and the manufacturing cost thereof is reduced.

The objectives, technical solutions and advantageous effects of the present application are further described in detail with reference to the above specific embodiments. It should be understood that the above embodiments are only the specific examples of the present application, rather than limiting the present application. Any of modifications, equivalents and the changes and so on which can be made to the present application without departing from the spirit and principle of the present application, shall be considered to fall within the scope of the present application.

What is claimed is:

1. A method for producing an array substrate, wherein the array substrate comprises a planarization layer provided on a layer for thin film transistors and a first electrode provided on the planarization layer for a light emitting device, the method comprising the steps of:

forming a pixel definition layer for placing the first electrode, a via hole for the first electrode and a spacer on the planarization layer by a single patterning process with a single mask, wherein the single patterning process comprises the steps of:

coating photo resist onto the planarization layer;

exposing the photo resist to light with the mask and developing it;

removing parts of the planarization layer together with the photoresist having different thicknesses at different positions of the planarization layer by an etching process, so as to form the via hole, the spacer and the pixel definition layer on the planarization layer; and peeling off non-removed photo resist.

2. The method for producing the array substrate according to claim 1, wherein in the step of exposing the photo resist to light with the mask and developing it, exposure light beam having different intensities passes through the mask, so that a photo resist fully reserved part, a first photo resist partially reserved part and a photo resist fully removed part are formed after carrying out the exposing and developing processes, wherein the photo resist fully reserved part corresponds to the spacer, the photo resist fully removed part corresponds to the via hole, the first photo resist partially reserved part corresponds to the pixel definition layer.

3. The method for producing the array substrate according to claim 2, wherein the photo resist is positive, and the mask comprises a first region, a second region and a third region corresponding to the via hole, the pixel definition layer and the spacer respectively, wherein the exposure light beam has a transmittivity at the first region larger than that at the second region, and the transmittivity of the exposure light beam at the second region is larger than that of the exposure light beam at the third region.

4. The method for producing the array substrate according to claim 3, wherein the transmittivity of the exposure light beam at the first region is 100%, the transmittivity of the exposure light beam at the second region is 65%-75%, and the transmittivity of the exposure light beam at the third region is 0.

5. The method for producing the array substrate according to claim 4, wherein the first region is a through hole extending through a thickness of the mask, and a thickness of the second region is less than that of the third region.

6. The method for producing the array substrate according to claim 4, wherein the mask further comprises a fourth region corresponding to a surface of the planarization layer, and the transmittivity of the exposure light beam at the fourth region is larger than that of the exposure light beam at the third region and less than that of the exposure light beam at the second region.

7. The method for producing the array substrate according to claim 6, wherein the exposure light beam has a transmittivity of 25-35% at the fourth region.

8. The method for producing the array substrate according to claim 6, wherein the first electrode electrically connected to a drain electrode of the thin film transistor in the layer for thin film transistors is formed at the via hole and the pixel definition layer by a Physical vapor deposition process, wherein a region where the pixel definition layer is located is formed as a recess with respect to the surface of the planarization layer.

9. The method for producing the array substrate according to claim 3, wherein the mask further comprises a fourth region corresponding to a surface of the planarization layer, and the transmittivity of the exposure light beam at the fourth region is larger than that of the exposure light beam at the third region and less than that of the exposure light beam at the second region.

10. The method for producing the array substrate according to claim 9, wherein the exposure light beam has a transmittivity of 25-35% at the fourth region.

11. The method for producing the array substrate according to claim 9, wherein the first electrode electrically connected to a drain electrode of the thin film transistor in the layer for thin film transistors is formed at the via hole and the pixel definition layer by a Physical vapor deposition process, wherein a region where the pixel definition layer is located is formed as a recess with respect to the surface of the planarization layer.

12. The method for producing the array substrate according to claim 2, wherein the photo resist is negative, and the mask comprises a fifth region, a sixth region and a seventh region corresponding to the via hole, the pixel definition layer and the spacer respectively, wherein the exposure light beam has a transmittivity at the fifth region less than that at the sixth region, and the transmittivity of the exposure light beam at the sixth region is less than that of the exposure light beam at the seventh region.

13. The method for producing the array substrate according to claim 12, wherein the transmittivity of the exposure light beam at the fifth region is 0, the transmittivity of the exposure light beam at the sixth region is 25%-35%, and the transmittivity of the exposure light beam at the seventh region is 100%.

14. The method for producing the array substrate according to claim 13, wherein a thickness of the fifth region is larger than that of the sixth region, and the seventh region is a through hole extending through a thickness of the mask.

15. The method for producing the array substrate according to claim 12, wherein the mask further comprises an eighth region corresponding to a surface of the planarization layer, and the transmittivity of the exposure light beam at the eighth region is less than that of the exposure light beam at the seventh region and larger than that of the exposure light beam at the sixth region.

16. The method for producing the array substrate according to claim 15, wherein the exposure light beam has a transmittivity of 65-75% at the eighth region.

17. The method for producing the array substrate according to claim 13, wherein the mask further comprises an eighth region corresponding to a surface of the planarization layer, and the transmittivity of the exposure light beam at the eighth region is less than that of the exposure light beam at the seventh region and larger than that of the exposure light beam at the sixth region.

18. The method for producing the array substrate according to claim 17, wherein the exposure light beam has a transmittivity of 65-75% at the eighth region.

19. An array substrate, produced by the method according to claim 1.

* * * * *